(12) United States Patent
Lee et al.

(10) Patent No.: US 8,450,712 B2
(45) Date of Patent: May 28, 2013

(54) RESISTANCE SWITCHABLE CONDUCTIVE FILLER FOR RERAM AND ITS PREPARATION METHOD

(75) Inventors: Sang-Soo Lee, Seoul (KR); Woojin Jeon, Jeonbuk (KR)

(73) Assignee: Korea Institute of Science and Technology, Seoul (KR)

( * ) Notice: Subject to any disclaimer, the term of this patent is extended or adjusted under 35 U.S.C. 154(b) by 86 days.

(21) Appl. No.: 13/160,687

(22) Filed: Jun. 15, 2011

(65) Prior Publication Data
US 2012/0241706 A1   Sep. 27, 2012

(30) Foreign Application Priority Data
Mar. 21, 2011   (KR) .................... 10-2011-0024928

(51) Int. Cl.
*H01L 47/00*   (2006.01)
(52) U.S. Cl.
USPC .................................. 257/2; 257/4
(58) Field of Classification Search
USPC .............. 257/2, 3, 4, 295, E29.002
See application file for complete search history.

(56) References Cited

U.S. PATENT DOCUMENTS
2006/0163554 A1 * 7/2006 Lankhorst et al. ............... 257/4

FOREIGN PATENT DOCUMENTS
KR    1020100094152 A    8/2010

* cited by examiner

*Primary Examiner* — Hoai V Pham
(74) *Attorney, Agent, or Firm* — Ladas & Parry LLP

(57) ABSTRACT

Disclosed are a resistive random-access memory (ReRAM) based on resistive switching using a resistance-switchable conductive filler and a method for preparing the same. When a resistance-switchable conductive filler prepared by coating a conductive filler with a material whose resistance is changeable is mixed with a dielectric material, the dielectric material is given the resistive switching characteristics without losing its inherent properties. Therefore, various resistance-switchable materials having various properties can be prepared by mixing the resistance-switchable conductive filler with different dielectric materials. The resulting resistance-switchable material shows resistive switching characteristics comparable to those of the existing metal oxide film-based resistance-switchable materials. Accordingly, a ReRAM device having the inherent properties of a dielectric material can be prepared using the resistance-switchable conductive filler.

6 Claims, 4 Drawing Sheets

RESISTANCE SWITCHABLE CONDUCTIVE FILLER FOR RERAM AND ITS PREPARATION METHOD

CROSS-REFERENCE TO RELATED APPLICATIONS

This application claims priority under 35 U.S.C. §119 to Korean Patent Application No. 10-2011-0024928, filed on Mar. 21, 2011 in the Korean Intellectual Property Office, the disclosure of which is incorporated herein by reference in its entirety.

TECHNICAL FIELD

The present disclosure relates to a resistive random-access memory (ReRAM) based on resistive switching using a resistance-switchable conductive filler (RSCF) and a method for preparing the same.

BACKGROUND

At present, DRAM and flash memory are the most frequently used memory devices in the electronics industry. Particularly, the flash memory is widely used since the related process is similar to that of DRAM, fine linewidths can be embodied due to simple structure, and it is a non-volatile memory. However, it is associated with the problems of increased difficulty in processing and deterioration of electrical properties beyond sub-30 nm as well as large power consumption and low operation speed due to the intrinsic high operation voltage.

As a new memory device to solve these problems, a resistive random-access memory (ReRAM), which is a low-power, highly-integrated, non-volatile memory capable of fast operation, is actively studied. The ReRAM is a memory using a material whose resistance changes under bias sweep. According to the resistive switching behavior, it is divided into the unipolar switching type and the bipolar switching type. Although the exact mechanism of each switching behavior is not clearly understood yet, it is known that unipolar switching is accomplished by the formation and extinction of a conducting path in the oxide film caused by dielectric breakdown, and bipolar switching is mainly explained by the change in Schottky barrier height or the formation of oxygen-deficient phase due to oxygen vacancy in the oxide film.

Recently, several groups are performing researches to provide transparency and flexibility to the ReRAM. The most studied flexible ReRAM is one obtained by depositing transition metal oxide such as $TiO_2$, ZnO, etc. thinly on a flexible substrate. Although the flexible ReRAM prepared using the transition metal oxide has good resistance ratio, endurance and uniformity, it achieves flexibility simply by thinly depositing an oxide film rather than improving the intrinsic property of the oxide film. Accordingly, it does not make a fundamental solution. In addition, transparency cannot be ensured by using metal oxide.

SUMMARY

The present disclosure is directed to providing a resistance-switchable material capable of solving the aforesaid problems, a resistive random-access memory including the same, and a method for preparing the same.

In one general aspect, the present disclosure provides a resistance-switchable material including: (A) a dielectric matrix; and (B) a resistance-switchable conductive filler dispersed in the dielectric matrix, wherein the resistance-switchable conductive filler includes (a) a conductive filler and (b) a transition metal oxide layer formed on at least a part of the conductive filler, and the resistance-switchable conductive filler is included in an amount such that it can form a conducting path inside the dielectric matrix by forming a network.

In another general aspect, the present disclosure provides a resistive random-access memory including: (1) a substrate; (2) a lower electrode disposed on the substrate; (3) a resistance-switchable material disposed on the lower electrode; and (4) an upper electrode disposed on the resistance-switchable material, wherein the resistance-switchable material includes (A) a dielectric matrix and (B) a resistance-switchable conductive filler dispersed in the dielectric matrix, and the resistance-switchable conductive filler includes (a) a conductive filler and (b) a transition metal oxide layer formed on the conductive filler.

In another general aspect, the present disclosure provides a method for preparing a resistance-switchable material including: (a) coating a transition metal oxide layer on at least a part of a conductive filler; (b) annealing the transition metal oxide layer to prepare a resistance-switchable conductive filler; and (c) dispersing the resistance-switchable conductive filler into a dielectric matrix.

In another general aspect, the present disclosure provides a method for preparing a resistive random-access memory including: (A) forming a lower electrode on a substrate; (B) coating a paste of a resistance-switchable material on the lower electrode and curing the paste; and (C) forming an upper electrode on the cured paste.

The conductive filler may be any material having high conductivity and a large aspect ratio. Specifically, single-walled carbon nanotube (SWCNT), Ag nanowire, Au nanowire, Pt nanowire, Cu nanowire, graphene, etc. may be used. Particularly, single-walled carbon nanotube or Ag nanowire may be used among them to maximize the desired effect.

The transition metal oxide may be $TiO_2$, $ZrO_2$, NiO, $HfO_2$, $Ta_2O_5$, $La_2O_3$, $Nb_2O_5$, $Cu_2O$, $Al_2O_3$, SiO, $SrTiO_3$, Cr-doped $SrZrO_3$, $Pr_{0.7}Ca_{0.3}MnO_3$, etc. Particularly, $TiO_2$, $ZrO_2$ or NiO may be used among them to maximize the desired effect.

The dielectric may be any insulating material that can be mixed with the resistance-switchable conductive filler. Specifically, urethane, poly(vinyl alcohol), silicone rubber, etc. may be used. Particularly, urethane or poly(vinyl alcohol) may be used among them to maximize the desired effect.

The substrate may be selected from glass, silicon wafer and metal foil, the lower electrode is selected from Pt, Au, Ag, Cu and polysilicon, the paste may be formed by spin coating, blade casting, drop casting or inkjet printing, and the lower electrode and the upper electrode may be formed by sputtering, chemical vapor deposition, atomic layer deposition, pulsed laser deposition or molecular beam epitaxy.

When Ag nanowire is used as the conductive filler and $TiO_2$ is used as the transition metal oxide, the resistance ratio between the low-resistance state and the high-resistance state is large and the initial resistance ratio can be maintained without decrease even after repeated resistance tests.

Unipolar resistance-switchable material may experience switching between the low-resistance state and the high-resistance state regardless of voltage sweep direction. The resistance ratio between the low-resistance state and the high-resistance state may be $10^1$-$10^{10}$. Specifically, it may be $10^4$ or greater. It is desired that the resistance ratio is as large as possible. Those skilled in the art will understand that the upper limit of the resistance ratio is not specifically restricted.

Specifically, the resistance ratio may be maintained at $10^4$ or greater until 100 cycles of repeated resistive switching test. Specifically, the resistance-switchable material may have a UV-Vis transmittance corresponding to 90-100% of the transmittance of the dielectric matrix only, and it may maintain its switching characteristics even after the resistance-switchable material is bent 50 times.

In another general aspect, the present disclosure provides a method for controlling the resistive switching characteristics of a resistance-switchable material to unipolar or bipolar by changing the kind of the resistance-switchable material to prepare the resistance-switchable conductive filler or test conditions such as the magnitude of applied electric field or current density, temperature, and atmosphere.

Resistance-switchable materials prepared according to the present disclosure satisfy the aforesaid physical properties. It is evident that those physical properties cannot be satisfied simply by using the same material. The present disclosure is not limited to specific preparation methods, but encompasses related constituents, structures and physical properties.

Other features and aspects will be apparent from the following detailed description, the drawings, and the claims.

BRIEF DESCRIPTION OF THE DRAWINGS

The above and other objects, features and advantages of the present disclosure will become apparent from the following description of certain exemplary embodiments given in conjunction with the accompanying drawings, in which.

DETAILED DESCRIPTION OF EMBODIMENTS

The advantages, features and aspects of the present disclosure will become apparent from the following description of the embodiments with reference to the accompanying drawings, which is set forth hereinafter. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The terminology used herein is for the purpose of describing particular embodiments only and is not intended to be limiting of the example embodiments. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments will be described in detail with reference to the accompanying drawings.

The present disclosure may be understood by the unipolar resistive switching mechanism. A conductive filament in the low-resistance state formed by soft breakdown is partly lost by local heating and switched to the high-resistance state. And then, a conductive filament is formed again above a predetermined electrical field. The resistive switching characteristics are caused by the repetition of this process.

Figure 1:
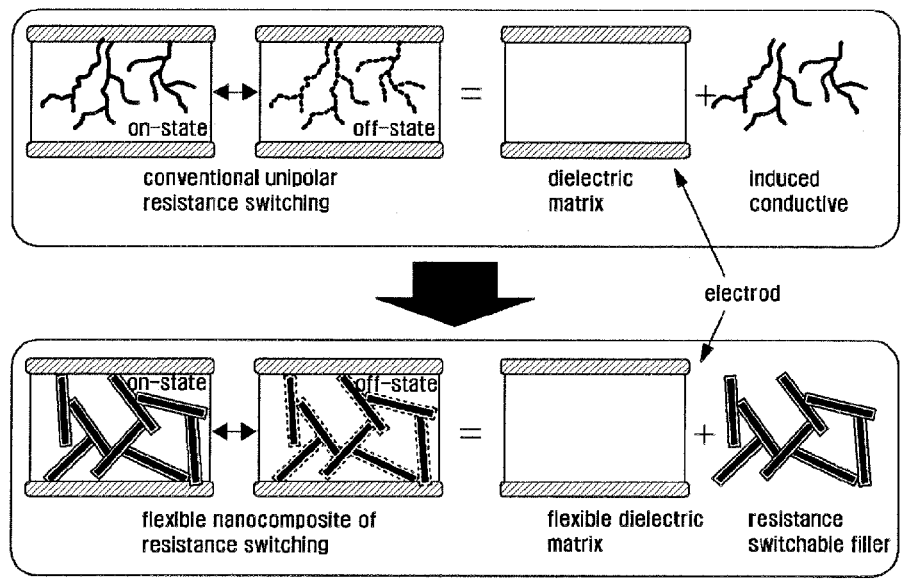
FIG. 1 schematically illustrates a concept and a configuration of a resistance-switchable material according to the present disclosure.

That is to say, the most important factor in unipolar resistive switching is by the formation and removal of the conductive filament in the dielectric or insulating material. In the present disclosure, "unipolar resistance-switchable material" or similar terms may be understood as a system in which a conducting path is formed and removed in a dielectric matrix. In the present disclosure, the so-called resistance-switchable conductive filler allowing the formation and removal of the conductive path is introduced into a dielectric matrix having no resistive switching characteristics at all. As a result, as if the formation and removal of the conductive path in the unipolar resistance-switchable material result in resistive switching, the resistance-switchable conductive filler results in the formation of a conducting path whose resistance changes in the dielectric matrix. Accordingly, the resistance-switchable material has resistive switching characteristics as well as the inherent properties of the dielectric matrix, and may be used as a ReRAM (FIG. 1). If the dielectric matrix is transparent and flexible, a transparent and flexible ReRAM may be embodied.

Especially, when $TiO_2$ is used, both unipolar and bipolar characteristics can be realized. It was confirmed that the SWCNT-$TiO_2$-epoxy system exhibits unipolar characteristics whereas the Ag—$TiO_2$-epoxy system shows bipolar characteristics. That is to say, unipolar or bipolar resistive switching characteristics may be selectively achieved by changing the kind of the resistance-switchable material (e.g., $TiO_2$) when preparing the resistance-switchable conductive filler.

EXAMPLES

The examples and experiments will now be described. The following examples and experiments are for illustrative purposes only and not intended to limit the scope of this disclosure.

Example 1

10 mg of acid-treated single-walled carbon nanotube SWCNT (Hanwha Nanotech) was dispersed in N,N-dimethylformamide (DMF) and reacted with 17 mL of deionized (DI) water and 10 mL of $TiCl_4$ (2 M) at 60° C. for 8 hours to form $TiO_2$ on the surface of the SWCNT. As a result, an SWCNT-$TiO_2$ resistance-switchable conductive filler was prepared. For crystallization, the $TiO_2$ was annealed in a furnace at 100° C. for 1 hour and then at 400° C. for 1 hour under an air atmosphere. Then, the SWCNT-$TiO_2$ resistance-switchable conductive filler was mixed with urethane epoxy using a paste mixer. In order to prepare a test unit cell for evaluating the resistive switching characteristics, a 100-nm thick Pt lower electrode was formed on a glass substrate by Pt sputtering, and an RSCF-epoxy paste was spin coated thereon at 3000 rpm for 60 seconds. After curing at 130° C. for 3 hours, an Ag upper electrode was formed on the resulting RSCF-epoxy film to prepare a MIM structure of Pt (lower electrode)/RSCF-epoxy composite/Ag (upper electrode).

Figure 2:
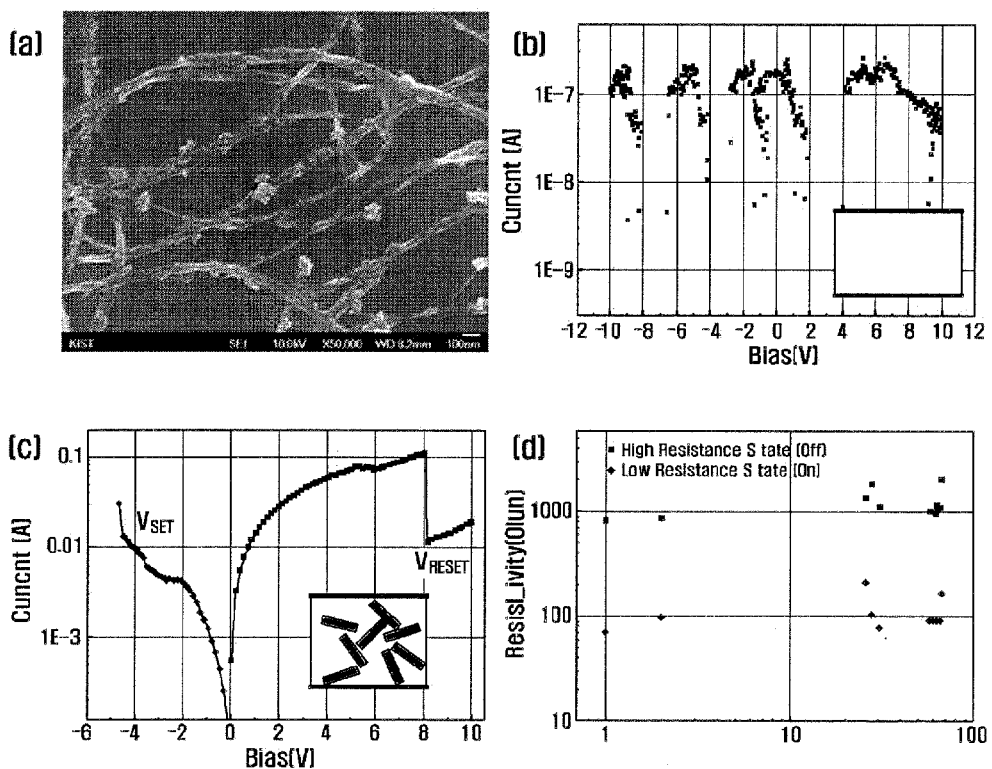
FIG. 2 shows a result of evaluating the characteristics of a resistance-switchable material comprising a single-walled carbon nanotube (SWCNT)-$TiO_2$ resistance-switchable conductive filler and urethane epoxy.

The microstructure of the resistance-switchable conductive filler prepared in Example 1 was observed. SEM analysis of the SWCNT-TiO$_2$ resistance-switchable conductive filler revealed that the TiO$_2$ was attached well to the SWCNT (FIG. 2a). XRD analysis revealed that the crystal state of the TiO$_2$ changed from amorphous to anatase after the annealing.

In order to confirm the resistive switching characteristics of the SWCNT-TiO$_2$ resistance-switchable conductive filler, the current-voltage curve was recorded after mixing with the epoxy (FIG. 2c). Whereas pure epoxy is a dielectric through which current cannot flow (FIG. 2b), the epoxy mixed with the SWCNT-TiO$_2$ resistance-switchable conductive filler exhibited the resistance switching behavior between the low-resistance state (LRS) and the high-resistance state (HRS) at a specific mixing proportion (FIG. 2c). The resistance ratio between the LRS and the HRS was about 10. To conclude, it was confirmed that the dielectric epoxy came to have the resistive switching characteristics through the addition of the resistance-switchable conductive filler, and the SWCNT-TiO$_2$-epoxy composite maintained the resistance ratio at 10 until about 100 cycles of repeated resistive switching test (FIG. 2d).

Example 2

A MIM structure was prepared in the same manner as in Example 1, except that an Ag—TiO$_2$ resistance-switchable conductive filler was prepared by reacting 10 mg of Ag nanowire (Bluenano) with 27 mL of DI water and 3 mL of TiCl$_4$ (2 M) at 60° C. for 8 hours and the Ag—TiO$_2$ resistance-switchable conductive filler was used instead of the SWCNT-TiO$_2$ resistance-switchable conductive filler.

Figure 4:
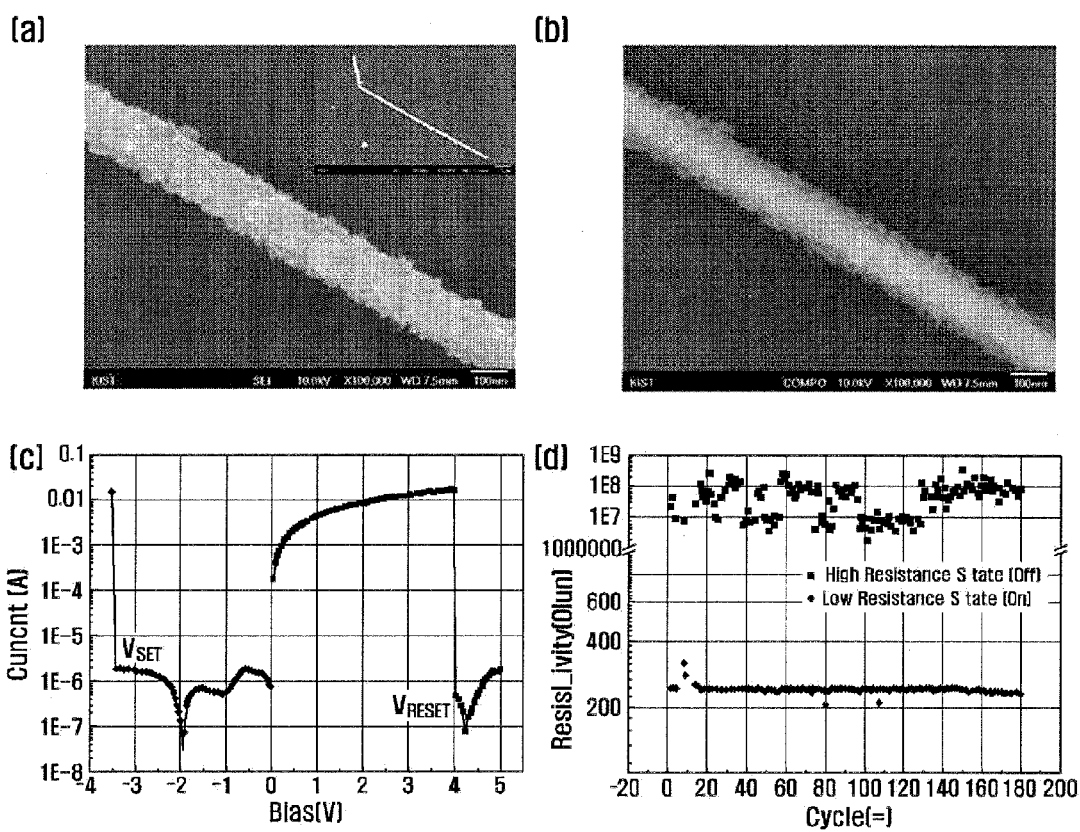
FIG. 4 shows a result of evaluating the characteristics of a resistance-switchable material comprising an Ag nanowire-$TiO_2$ resistance-switchable conductive filler and urethane epoxy.

The TiO$_2$ was conformally coated on the Ag surface unlike on the SWCNT where it was coated partly (FIG. 4a, 4b).

The current-voltage curve was recorded for an Ag—TiO$_2$-epoxy system prepared by mixing 10 mg of Ag—TiO$_2$ with 3 g of epoxy. As seen from FIG. 4c, a typical current-voltage characteristic of resistive switching was obtained. The resistance ratio was $10^4$-$10^7$, significantly improved when compared with Example 1. Also, unlike the SWCNT-TiO$_2$-epoxy system, resistive switching was observed at every cycle of cycling test, and the resistance value and the resistance ratio was maintained constant (FIG. 4d).

Figure 5:
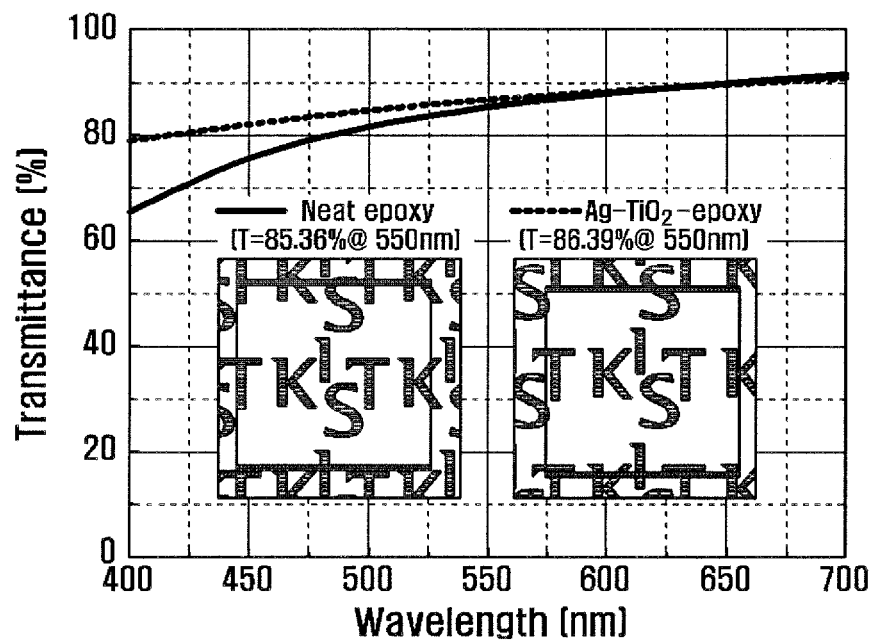
FIG. 5 shows a result of analyzing the transparency of a resistance-switchable material according to the present disclosure using a UV-Vis spectrometer.
Figure 5:
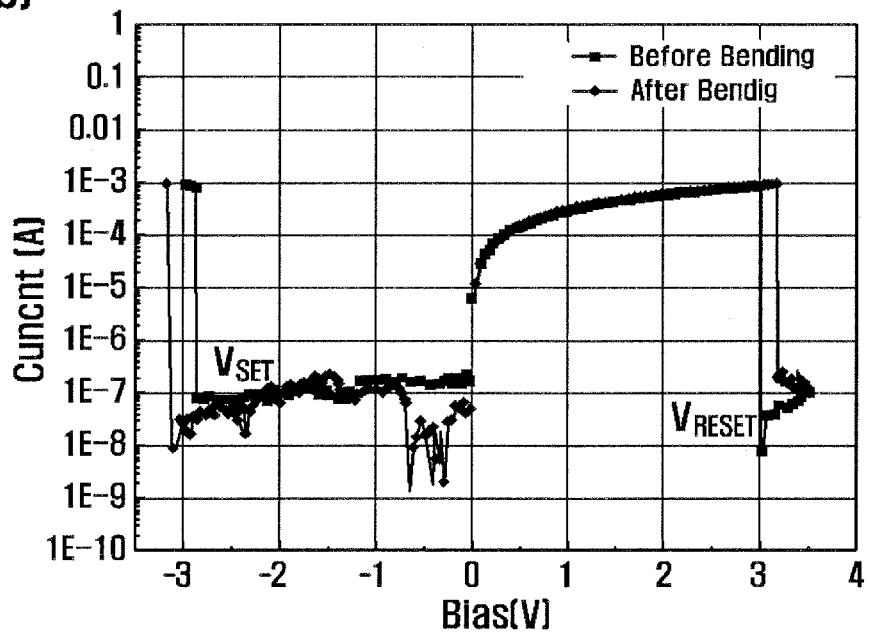

It was observed whether the transparency and flexibility of epoxy are retained after mixing with the resistance-switchable conductive filler. UV-Vis transmittance was observed under the condition where the resistive switching characteristics are exhibited. A high transmittance of 80% or greater was observed in the visible region. The relative transmittance as compared to pure epoxy was 100%, showing that the transparency of epoxy is not sacrificed (FIG. 5a). And, flexibility was evaluated by bending a sample several times, which was prepared by coating the Ag—TiO$_2$-epoxy composite on a Cu film, and recording the current-voltage curve. The resistance switching characteristics were maintained well even after bending several times (FIG. 5b).

Comparative Examples 1-2

Figure 3:
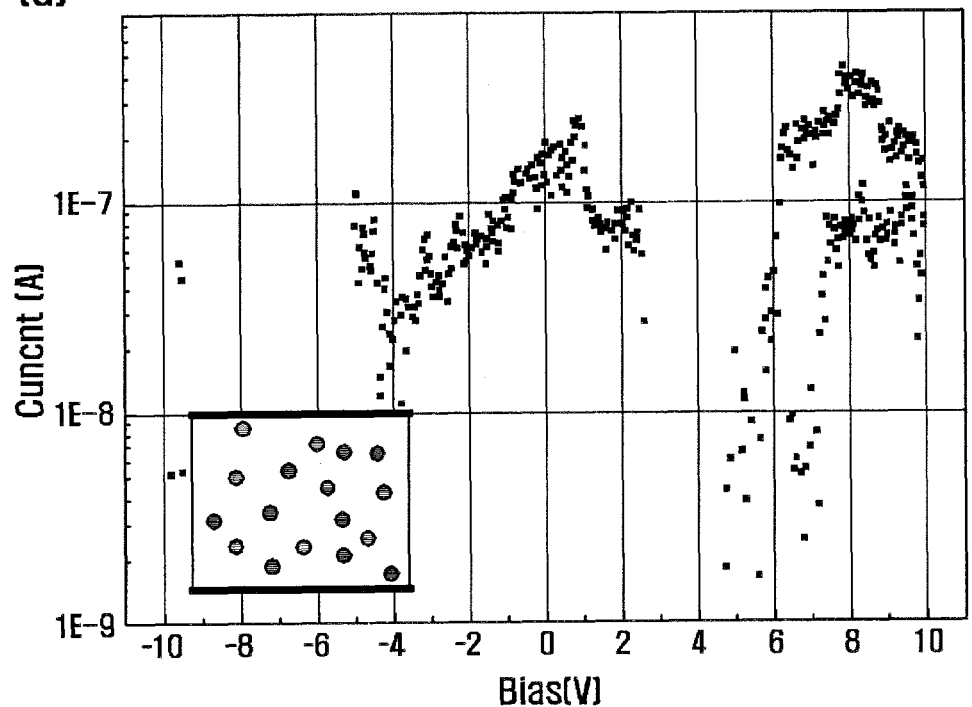
FIG. 3 shows current-voltage curves revealing that a dielectric is not converted into a resistance-switchable material when a resistance-switchable conductive filler is not used.
Figure 3:
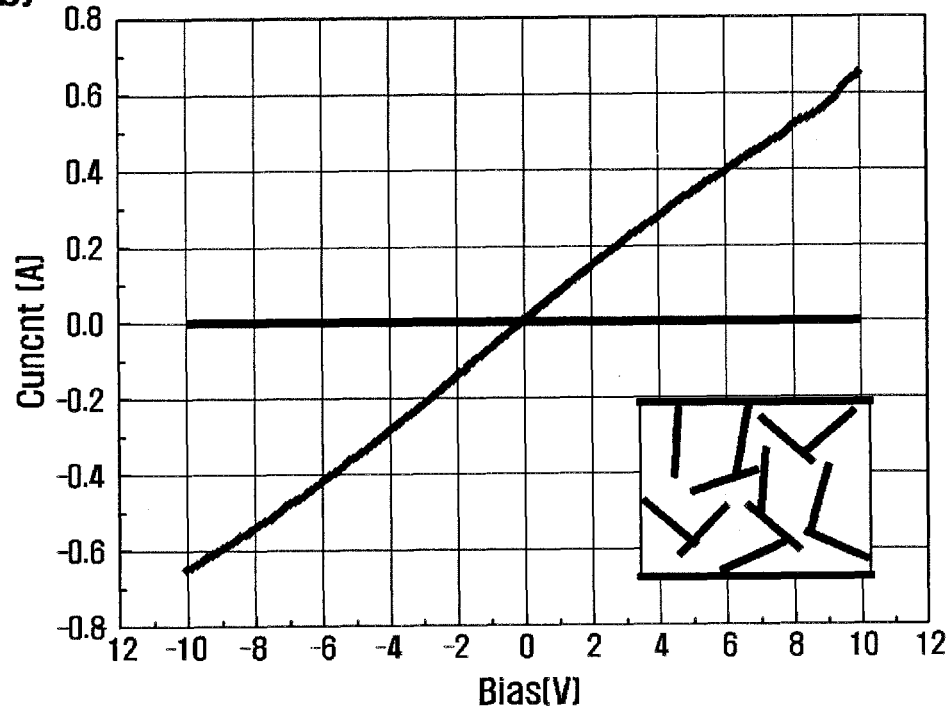

MIM structures were prepared in the same manner as in Example 1, except for mixing the epoxy matrix only with TiO$_2$ powder (Comparative Example 1, FIG. 3a) or mixing the epoxy matrix only with SWCNT (Comparative Example 2, FIG. 3b).

The current-voltage curves were recorded. Very low current was maintained in Comparative Example 1 comparably to pure epoxy.

As for Comparative Example 2, current was maintained low prior to percolation of the SWCNT, but increased rapidly after the percolation. Resistive switching was not observed.

Thus, the present disclosure provides a method for providing resistive switching characteristics without sacrificing the inherent properties of a dielectric material by adding a resistance-switchable conductive filler to the dielectric material. When a transparent, flexible dielectric material is mixed with the resistance-switchable conductive filler, a transparent, flexible ReRAM device exhibiting better performance than the existing metal oxide- or polymer-based devices can be prepared. That is to say, the resistance-switchable conductive filler according to the present disclosure enables a dielectric material with no resistive switching characteristics to be changed into a resistance-switchable material through simple mixing. Further, since the intrinsic properties of the dielectric material can be retained, resistance-switchable materials with various properties can be prepared.

While the present disclosure has been described with respect to the specific embodiments, it will be apparent to those skilled in the art that various changes and modifications may be made without departing from the spirit and scope of the disclosure as defined in the following claims.

What is claimed is:

1. A resistance-switchable material comprising:
   a dielectric matrix; and
   a resistance-switchable conductive filler dispersed in the dielectric matrix,
   wherein the resistance-switchable conductive filler comprises a conductive filler and a transition metal oxide layer formed on at least a part of the conductive filler, and the resistance-switchable conductive filler is included in an amount such that it can form a conducting path inside the dielectric matrix by forming a network.

2. The resistance-switchable material according to claim 1, wherein the conductive filler is selected from single-walled carbon nanotube, Ag nanowire, Au nanowire, Pt nanowire, Ag nanowire, Cu nanowire and graphene, the transition metal oxide is selected from TiO$_2$, ZrO$_2$, NiO, HfO$_2$, Ta$_2$O$_5$, La$_2$O$_3$, Nb$_2$O$_5$, Cu$_2$O, Al$_2$O$_3$, SiO, SrTiO$_3$, Cr-doped SrZrO$_3$ and Pr$_{0.7}$Ca$_{0.3}$MnO$_3$, and the dielectric is selected from urethane, poly(vinyl alcohol) and silicone rubber.

3. The resistance-switchable material according to claim 2, wherein the resistance-switchable material experiences switching between the low-resistance state and the high-resistance state regardless of voltage sweep direction, and the resistance ratio between the low-resistance state and the high-resistance state is $10^1$-$10^{10}$.

4. The resistance-switchable material according to claim 3, wherein the resistance ratio is $10^4$ or greater is maintained at $10^4$ or greater until 100 cycles of repeated resistive switching test.

5. The resistance-switchable material according to claim 4, wherein the resistance-switchable material has a UV-Vis transmittance corresponding to 90-100% of the transmittance of the dielectric matrix only, and maintains its switching characteristics even after the resistance-switchable material is bent 50 times.

6. A resistive random-access memory comprising:
   a substrate;
   a lower electrode disposed on the substrate;
   a resistance-switchable material disposed on the lower electrode; and
   an upper electrode disposed on the resistance-switchable material,
   wherein the resistance-switchable material comprises a dielectric matrix and a resistance-switchable conductive filler dispersed in the dielectric matrix, and the resistance-switchable conductive filler comprises a conductive filler and a transition metal oxide layer formed on the conductive filler.

* * * * *